(12) United States Patent
Mallat

(10) Patent No.: US 8,620,979 B2
(45) Date of Patent: Dec. 31, 2013

(54) FILTER BANKS FOR ENHANCING SIGNALS USING OVERSAMPLED SUBBAND TRANSFORMS

(75) Inventor: Stéphane Mallat, Paris (FR)

(73) Assignee: Zoran (France) S.A., Neuilly-sur-Seine (FR)

( * ) Notice: Subject to any disclaimer, the term of this patent is extended or adjusted under 35 U.S.C. 154(b) by 917 days.

(21) Appl. No.: 12/740,233

(22) PCT Filed: Dec. 26, 2007

(86) PCT No.: PCT/IB2007/055406
§ 371 (c)(1),
(2), (4) Date: Apr. 28, 2010

(87) PCT Pub. No.: WO2009/081238
PCT Pub. Date: Jul. 2, 2009

(65) Prior Publication Data
US 2010/0253447 A1  Oct. 7, 2010

(51) Int. Cl.
*G06F 17/10* (2006.01)

(52) U.S. Cl.
USPC .......................................... 708/300

(58) Field of Classification Search
USPC ................. 708/300–323
See application file for complete search history.

(56) References Cited

U.S. PATENT DOCUMENTS

| | | | |
|---|---|---|---|
| 4,389,538 A * | 6/1983 | White | 708/316 |
| 4,729,112 A * | 3/1988 | Millar | 708/300 |
| 5,384,725 A | 1/1995 | Coifman et al. | |
| 5,526,299 A | 6/1996 | Coifman et al. | |
| 5,917,943 A | 6/1999 | Washizawa | |
| 5,999,954 A * | 12/1999 | Ludwig et al. | 708/312 |
| 6,233,357 B1 | 5/2001 | Li et al. | |
| 6,836,569 B2 | 12/2004 | Le Pennec et al. | |
| 2006/0165174 A1 | 7/2006 | Bernard et al. | |

FOREIGN PATENT DOCUMENTS

WO    2006079997 A    3/2006

OTHER PUBLICATIONS

Stephane G. Mallat, "A Theory for Multiresolution Signal Decomposition: The Wavelet Representation," IEEE Transactions on Pattern Analysis and Machine Intelligence, Jul. 11, 1989, pp. 674-693, vol. 11, No. 7, New York, US.

Bo Liu and L.T. Bruton, "The Design of Nonuniform-Band Maximally Decimated Filter Banks," Department of Electrical & Computer Engineering, The University of Calgary, Calgary, Alberta, Canada, pp. 375-378.

(Continued)

*Primary Examiner* — Tan V. Mai
(74) *Attorney, Agent, or Firm* — Lando & Anastasi, LLP

(57) ABSTRACT

For subband decomposition of a d-dimensional input signal (S) into a number K of subband components ($F_1$-$F_4$), a filter bank has a filtering module (801) transforming the input signal (S) into $2^d$ components including a low-frequency component (L) and $2^d-1$ higher-frequency components ($F_1$), The $2^d-1$ higher-frequency components are oversampled, typically by a factor 2, compared to the low-frequency component. The low-frequency component can be further decomposed by means of another filtering module having a similar structure, and the process can be iterated over any number of scales. The reconstruction filter bank has a symmetric structure, with filtering modules adapted to the oversampling of the higher-frequency components. Such filter banks are well suited to various enhancement processing applied to the subband components such as thresholding, reduction of compression distortion, reduction of measurement noise, sharpness enhancement.

31 Claims, 5 Drawing Sheets

(56) References Cited

OTHER PUBLICATIONS

Martin Schonle and Norbert J. Fliege, "1/M-Octave-Band Filter Banks and Wavelets," IEEE International Symposium on Circuits and Systems, Jun. 9-12, 1997, pp. 2413-2416, Hong Kong.

N.J. Fliege and U. Zolzer, "Multi-Complementary Filter Bank," Hamburg University of Technology, D-2100 Hamburg 90, Germany, pp. 193-196.

Mark J. Shensa, "The Discrete Wavelet Transform: Wedding the A' Trous and Mallat Algorithms," IEEE Transaction on Signal Processing, Oct. 1992, pp. 2464-2482, No. 10, New York, US.

Martin Vetterli, "Wavelets and Filter Banks; Theory and Design," Sep. 1992, pp. 2207-2232, IEEE Transaction on Signal Processing, No. 9, New York, US.

Tsuhan Chen and P.P. Vaidyanathan, "Vector Space Framework for Unification of One—and Multidimensional Filter Bank Theory," IEEE Transaction on Signal Processing, Aug. 1994, pp. 2006-2021, No. 8, New York, US.

David L. Donoho and Iain M. Johnstone, "Ideal Spatial Adaptation by Wavelet Shrinkage," Department of Statistics, Stanford University, Stanford, CA, 94305, US, 1994, pp. 425-455, vol. 81, No. 3.

International Search Report and Written Opinion in corresponding International Application No. PCT/IB2007/055406 dated, Sep. 29, 2008.

Daubechies et al., "Factoring Wavelet Transforms into Lifting Steps", Program for Applied and Computational Mathematics, Priceton, University, Princeton, NJ, pp. 1-26, Sep. 1996, revised Nov. 1997.

Daubechies et al., "Wavelets on Irregular Point Sets", Phil, Trans. R. Soc. Long. pp. 1-16, 1999.

Donoho et al., "Ideal Spatial Adaptation by Wavelet Shrinkage", Department of Statistics, Stanford University, Stanford, California, USA, Jun. 1992 revised Apr. 1993, pp. 1-40.

Dragotti et al., "Footprints and Edgeprints for Image Denoising and Compression", Proceedings 2001 International Conference on Image Processing. ICIP 2001. Thessaloniki, Greece, Oct. 7-10, 2001, International Conference on Image Processing, New York, NY: IEEE, US, vol. 2 of 3. Conf. 8, pp. 237-240, XP001045559.

Feig et al., "Computing Image Histogram from Compressed Date", SPIE 2898:118-124.

Hilton, "Wavelet and Wavelet Packet Compression of Electrocardiograms", Technological Report TR9505, Department of Computer Science, The University of South Carolina, Columbia, pp. 1-12.

Kalifa et al., "Minimax Restoration and Deconvolution", Name of Pub., pp. 1-25.

Mallat, "A Theory of Multiresolution Signal Decomposition: The Wavelet Representation", IEEE Transactions on Pattern Analysis and Machine Intelligence 11:674-693, 1989.

Mallat et al., "Analysis of Low Bit Rate Image Transform Coding", IEEE Transaction on Signal Processing 46:1027-1042, 1998.

Mandal et al., "Fast Wavelet Histogram Techniques for Image Indexing", School of Information Technology and Engineering, University of Ottawa, Ottawa, Canada, pp. 1-15.

Mertins, "Image Compression via Edge-Based Wavelet Transform", University of Wollongong, Australia, pp. 1-21.

Pennec et al., "Image Compression with Geometrical Wavelets", IEEE pp. 661-664, 2000.

Smith et al., "Exact Reconstruction Techniques for Tree-Structured Subband Coder", IEEE Transactions on Acoustics, Speech, and Signal Processing ASSP-34:434-441, 1986.

Starck et al., "The Curvelet Transform for Image Denoising", IEEE Transactions on Image Processing 11:670-684, 2002.

Starck et al., "Very High Quality Image Restoration by Combining Wavelets and Curvelets", Wavelets: Applications in Signal and Image Processing IX, San Diego, CA, USA, Jul. 30-Aug. 1, 2001, 4478:9-19, XP002244432.

Thevenaz et al., "Interpolation Revisited", IEEE Transactions on Medical Imaging 19:739-758, 2000.

Xu et al., "Three-Dimensional Embedded Subband Coding with Optimized Truncation (3-D Escot)", Applied and Computational Harmonic Analysis 10:290-315, 2001.

\* cited by examiner

FILTER BANKS FOR ENHANCING SIGNALS USING OVERSAMPLED SUBBAND TRANSFORMS

BACKGROUND OF THE INVENTION

The present invention relates to signal processing technology and more particularly to techniques for enhancing signals, such as by removing noise, artifacts or blur, enhancing sharpness, etc.

It is generally applicable to the enhancement of d-dimensional signals, where d is some positive integer ($d \geq 1$). Audio signals are examples of one-dimensional signals. Images are examples of two-dimensional signals. Three-dimensional signals may correspond to, e.g., video sequences or three-dimensional blocks of data such as seismic data or medical imaging data. Enhancement is distinguished from compression which either maintains or degrades the signal in order to construct a compact binary code representing it.

Signal enhancement or restoration is a process that improves an input digital signal by removing noise components or by suppressing existing distortions introduced by some prior transformation or degradation process such as blurring or signal compression. Sharpening the signal by removing blur is a form of signal restoration as well as removal of compression artifacts or any additive noise.

Many efficient signal enhancement methods are implemented by means of filter banks that transform the signal into a set of subband signals. Wavelet and wavepacket transforms are examples of such subband transformations. Typically, the transformed coefficients are then processed with simple non-linear amplification or attenuation operators such as soft or hard thresholding operators or block thresholding operators, as described in D. Donoho and I. Johnstone "Ideal spatial adaptation via wavelet shrinkage", Biometrika, vol. 81, pp. 425-455, December 1994. An inverse subband transform is then used reconstruct an enhanced signal from the processed subband coefficients.

The filter banks used for subband decomposition implement orthogonal or biorthogonal subband transforms with critically-sampled filter banks, as described in M. Vetterli and C. Herley, "Wavelets and filter banks, theory and design", IEEE Transactions on Signal Processing, vol. 40, no. 9, pp. 2207-2232, September 1992. The inverse subband transform is performed by means of perfect reconstruction filters. For a signal of size N, the total number of subband coefficients is also equal to N. The memory size and the number of operations required by critically-sampled filter bank transforms is proportional to N. Orthogonal or biorthogonal wavelet transforms are instances of such transforms. These transforms are computationally very efficient but the subsampling incorporated in the filter bank introduces grid artefacts on the reconstruction. This is particularly visible with a Haar wavelet transform where the reconstructed image has block artifacts (see FIG. 14(c)).

Translation-invariant subband transforms have been introduced to avoid such grid artifacts. A translation-invariant subband transform is implemented by means of a filter bank using an "a trou algorithm" without any subsampling, with zeros incorporated between filter coefficients, as described in M. J. Shensa "The discrete wavelet transform: wedding the à trous and Mallat algorithms", IEEE Transactions on Signal Processing, vol. 40, no. 10, pp. 2464-2482, October 1992. Translation-invariant subband transforms remove the grid artifacts and generally improve the peak signal-to-noise ratio (PSNR) of enhancement systems compared to equivalent critically-sampled subband transforms. However, they require much larger memory size and computational complexity.

Compared to a critically subsampled filter bank, a translation invariant filter bank increases the memory size and the number of operations by a factor that is approximately equal to the number of frequency subbands. For a wavelet transform computed over J scales, this factor is J+1 for one-dimensional signals, 3J+1 for two-dimensional signals and 7J+1 for three-dimensional signals. The number of scales J is larger than 3 in many applications. For other wavelet packet subband transforms, these factors are often larger than for a wavelet transform.

There is a need for subband transform schemes that attenuate grid artefacts with a smaller computational and memory cost than translation-invariant subband transforms. This is particularly important for large size signals such as images and videos, for real-time processing applications.

SUMMARY OF THE INVENTION

Filter banks for subband decomposition and reconstruction of a d-dimensional signals are proposed (d being an integer at least equal to 1), as well as a signal enhancement system making use of such filter banks.

On the input side, the filter bank decomposes an input signal into a number K of subband components for processing. It comprises a filtering module for transforming the input signal into $2^d$ components including a low-frequency component and $2^d-1$ higher-frequency components. These $2^d-1$ higher-frequency components are oversampled compared to the low-frequency component.

In an embodiment, the low-frequency component is downsampled by a factor $2^d$ compared to the input signal. The $2^d-1$ higher-frequency components may then include; a highest-frequency component having as many samples as the input signal; and, if $d>1$, further components oversampled by respective factors $2^i$ compared to the low-frequency component, each i being an integer greater than 0 and smaller than d.

The subband decomposition can be performed over multiple scales. The filter bank then comprises filtering modules organized in a tree of depth J, J being the number of scales of the subband decomposition. Each of the filtering modules can be arranged to transform a respective input signal into $2^d$ respective components including a low-frequency component and $2^d-1$ higher-frequency components oversampled compared to the respective low-frequency component. The input signal of the filter bank is then the respective input signal of a filtering module at the root of the tree.

In an embodiment using a wavelet type of transform, the total number of filtering modules in the tree will typically be J, with the J modules arranged in cascade, the low-frequency component from the j-th filtering module being the input signal to the (j+1)-th filtering module, for j=1, ..., J-1. In such a J-scale embodiment, the K subband components may include the low-frequency component from the J-th filtering module and the $2^d-1$ higher-frequency components from each one of the J cascaded filtering modules. The low-frequency component from the J-th filtering module is typically downsampled by a factor $2^{d \cdot J}$ compared to the input signal, and the K subband components include:

the low-frequency component from the J-th filtering module;

a highest-frequency component oversampled by a factor $2^d$ compared to said low-frequency component; and if at least one of d and J is greater than 1, further components oversampled by respective factors $2^i$ compared to said low-frequency component, each i being an integer greater than 0 and smaller than d.J.

If a wavelet packet type of transform is used, there will generally be more than one filtering module per level in the tree of the decomposition filter bank.

In an embodiment, each filtering module is made of $2^d-1$ filtering units arranged in a binary tree having d levels. For $1 \le i \le d$, the i-th level in the tree has $2^{i-1}$ filtering units each receiving a respective input signal and producing a respective output low-frequency signal and a respective output high-frequency signal oversampled compared to said respective output low-frequency signal. The input signal of the filtering module is the input signal of the filtering unit of the first level in the tree. For any $i>1$, the output low-frequency and high-frequency signals from the $2^{i-2}$ filtering units of the (i−1)-th level in the tree are the respective input signals of the $2^{i-1}$ filtering units of the i-th level in the tree. The $2^d$ respective components from the filtering module are the output low-frequency and high-frequency signals from the $2^{d-1}$ filtering units of the d-th level in the tree.

On the output side, the filter bank reconstructs an output signal from K processed subband components. It comprises a filtering module for generating the output signal from $2^d$ components obtained from the K subband components, including a low-frequency component and $2^d-1$ higher-frequency components. These $2^d-1$ higher-frequency components are oversampled compared to said low-frequency component.

In an embodiment of the reconstruction filter bank, the output signal is oversampled by a factor $2^d$ compared to the low-frequency component, and the $2^d-1$ higher-frequency components include a highest-frequency component having as many samples as the output signal and, if d>1, further components oversampled by respective factors $2^i$ compared to the low-frequency component, each i being an integer greater than 0 and smaller than d.

When the subband components supplied to the reconstruction filter bank result from a wavelet decomposition over multiple scales (J), the filter bank may include J cascaded filtering modules. Each of the filtering modules is arranged to transform $2^d$ respective input components, including a low-frequency component and $2^d-1$ higher-frequency components oversampled compared to the respective low-frequency component, into a respective output signal. For $j=1, \ldots, J-1$, the output signal from the j-th filtering module is then the respective low-frequency component supplied to the (j+1)-th filtering module, while the output signal from the J-th filtering module is the output signal of the filter bank. In such a J-scale embodiment, the $2^d-1$ higher-frequency components supplied to each of the J cascaded filtering modules and the low-frequency component supplied to the first filtering module can be components from the input K subband components. The output signal is typically oversampled by a factor $2^{d.J}$ compared to the low-frequency component supplied to the first filtering module, and the K subband components include:

the low-frequency component supplied to the first filtering module;

a highest-frequency component oversampled by a factor $2^d$ compared to the low-frequency component supplied to the first filtering module; and if at least one of d and J is greater than 1, further components oversampled by respective factors $2^i$ compared to the low-frequency component supplied to the first filtering module, each i being an integer greater than 0 and smaller than d.J.

For $j=1, \ldots, J-1$, the output signal from the j-th filtering module is then the respective low-frequency component supplied to the (j+1)-th filtering module, while the output signal from the J-th filtering module is the output signal of the filter bank.

When the subband components supplied to the reconstruction filter bank result from a wavelet packet decomposition over multiple scales (J), the filter bank may include filtering modules arranged in a tree of depth J. Each of the filtering modules is arranged to transform $2^d$ respective input components, including a low-frequency component and $2^d-1$ higher-frequency components oversampled compared to the respective low-frequency component, into a respective output signal.

In an embodiment of the reconstruction filter bank, each filtering module is made of $2^d-1$ filtering units arranged in a binary tree having d levels. For $1 \le i \le d$, the i-th level in the tree has $2^{d-i}$ filtering units each receiving a respective input low-frequency signal and a respective input high-frequency signal oversampled compared to the respective input low-frequency signal and producing a respective output signal. The $2^d$ respective input components supplied to the filtering module are distributed as respective input low-frequency and high-frequency signals to the $2^{d-1}$ filtering units of the first level in the tree. For any $i>1$, the respective input low-frequency and high-frequency signals of the $2^{d-i}$ filtering units of the i-th level in the tree are the respective output signals from the $2^{d-i+1}$ filtering units of the (i−1)-th level in the tree. The output signal of the filtering module is the output signal of the filtering unit of the d-th level in the tree.

One or more of the filtering units can be structured with:

a first branch for filtering an upsampled version of the respective input low-frequency signal of the filtering unit to form a first component signal;

a second branch for filtering a first modified version of the respective input high-frequency signal of the filtering unit, in which the odd samples are replaced by zeroes, to form a second component signal;

a first adder to form a first partially reconstructed signal as a sum of the first and second component signals;

a third branch for filtering the partially reconstructed signal to form a third component signal;

a fourth branch for filtering a second modified version of the respective input high-frequency signal of the filtering unit, in which the even samples are replaced by zeroes, to form a fourth component signal;

a second adder to form a second partially reconstructed signal as a sum of the third and fourth component signals; and a combiner to produce the respective output signal of the filtering unit as a combination of the first and second partially reconstructed signals.

The K processed subband components being obtained from a subband decomposition involving a low-pass filter $h_1$ and a high-pass filter $g_1$, the filtering performed in the first and second branches is preferably based on respective filters $h_2$ and $g_2$ such that the filter pairs $\{h_1, g_1\}$ and $\{h_2, g_2\}$ verify a perfect reconstruction property. The filtering performed in the third branch is based on a combination of filters $h_1$ and $h_2$, while the filtering performed in the fourth branch is also based on filter $g_2$.

Alternatively, one or more of the filtering units can be structured with:

a first filter for generating a first even sub-component from the respective input low-frequency signal of the filtering unit;

a second filter for generating a first odd sub-component from the respective input low-frequency signal of the filtering unit;

a third filter for generating a second even sub-component from a first downsampled version of the respective input high-frequency signal of the filtering unit;

a fourth filter for generating a second odd sub-component from said first downsampled version of the input high-frequency signal;

a fifth filter for generating a third even sub-component from a second downsampled version of the respective input high-frequency signal of the filtering unit;

a sixth filter for generating a third odd sub-component from said second downsampled version of the input high-frequency signal;

a combiner to produce the respective output signal of the filtering unit having even components respectively obtained as a sum of the first, second and third even sub-components and as a sum of the first, second and third odd sub-components.

The K processed subband components being obtained from a subband decomposition involving a high-pass filter $g_1$ and a low-pass filter $h_1$ implemented in a polyphase filtering arrangement, the first, second, third, fourth, fifth and sixth filters are defined from the low-pass and high-pass filters $h_1$, $g_1$ and from respective inverse filters $h_2$ and $g_2$ such that the filter pairs $\{h_1, g_1\}$ and $\{h_2, g_2\}$ verify a perfect reconstruction property.

The above-disclosed filter banks for subband decomposition and reconstruction have been studied and it was found that they can eliminate or at least reduce substantially grid or block artifacts introduced by known critically-sampled filter banks. This is achieved at the cost of an increase of complexity in terms of computation and memory requirements. Yet, the increase of complexity is much smaller than it is for known alternatives including translation-invariant filter banks.

For a wavelet transform over J scales of a one-dimensional signal, a twice oversampled filter bank increases by about a factor 2 the memory and number of operations relatively to a critically-sampled filter bank, whereas this factor is J+1 for a translation-invariant transform. For images (2D signals), the memory and number of operations increase by a factor about 3 for a twice oversampled filter bank as opposed to 3J+1 for a translation-invariant filter bank. For a video (3D signal), this increasing factor is approximately 4 for a twice oversampled filter bank as opposed to 7J+1 for a translation invariant filter bank. For typical values of J≥3, twice oversampled filter banks thus reduce the memory and computations by an important factor compared to translation-invariant filter banks, for signal enhancement systems or in other applications of subband decomposition/reconstruction.

A signal enhancement system according to the invention comprises:
  a first filter bank as disclosed above for subband decomposition of an input signal into a number K of subband components;
  a subband enhancement module for processing the K subband components from the first filter bank and forming K enhanced subband component; and
  a second filter bank as disclosed above for reconstruction of an output signal from the K enhanced subband components.

The subband enhancement module may be arranged to perform a processing selected from such processing as thresholding, reduction of compression distortion, reduction of measurement noise, sharpness enhancement.

The signal enhancement system is implemented using filter bank decomposition with an oversampling and an inverse filter bank reconstruction. The oversampling is typically by a factor two. The twice oversampled filter bank removes nearly all grid artifacts produced by a critically-sampled filter bank, with a significantly a lower memory and computational cost than a translation invariant filter bank.

The system can be implemented by means of either hardware of software. In the hardware case, the important reduction of the memory size requirement is an important factor for cost reduction.

BRIEF DESCRIPTION OF THE DRAWINGS

The foregoing and other objects of this invention, the various features thereof, as well as the invention itself, may be more fully understood from the following description, when read together with the accompanying drawings in which.

DESCRIPTION OF EMBODIMENTS

The formalism of the mathematical expressions in the following is well known to those skilled in the art. We write $$f * h[n] = \sum_m f[n-m] \cdot h[m]$$

the one dimensional convolution, also called filtering, of a signal f[n] with a filter h[n]. The z-transform of f is $$\hat{f}(z) = \sum_{n=-\infty}^{+\infty} f[n] \cdot z^{-n}.$$

Figure 1:
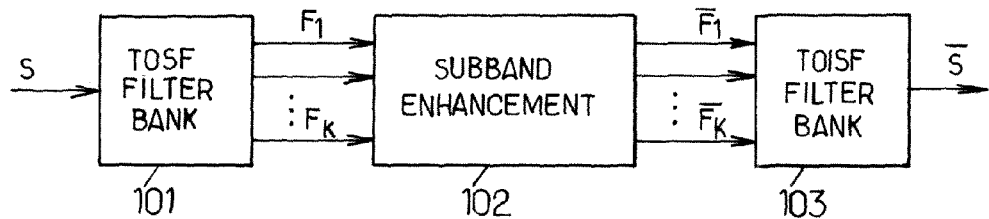
FIG. 1 is a block diagram of signal enhancement system.

For a signal or filter f[n], a polyphase filtering separates the even component corresponding to even samples $f_e[n]$ and the odd component corresponding to odd samples $f_o[n]$, which are defined by $\hat{f}(z)=\hat{f}_e(z^2)+z^{-1}.\hat{f}_o(z^2)$ FIG. 1 shows a system exemplifying the present invention. It takes in input a d-dimensional digital signal S. This input signal S is specified by its values over a d-dimensional sampling grid. Each sampling point is written $n=(n_1, \ldots, n_d)$, where $n_1, n_2, \ldots, n_d$ are integers, and the corresponding signal value is denoted S[n]. Audio signals are examples of 1-dimensional signals, images are examples of 2-dimensional signals, and video image sequences are examples of 3-dimensional signals. The system of FIG. 1 outputs an enhanced signal $\overline{S}$ that is defined on the same sampling grid as the input.

The system of FIG. 1 has a twice oversampled subband filter (TOSF) bank 101 receiving the original signal S. The filter bank 101 computes a twice oversampled subband transform and outputs twice oversampled subband signals $(F_k)_{1 \le k \le K}$ that carry the signal information over different frequency subbands. The number K of frequency subbands depends upon the type of subband transform.

A subband enhancement module 102 receives the K subband signals $(F_k)_{1 \le k \le K}$ and outputs enhanced subband signals $(\overline{F}_k)_{1 \le k \le K}$ using any state of the art enhancement operators. The enhancement calculation is performed according to a particular application. Noise reduction, reduction of block artifacts produced by compression algorithms, sharpness enhancement and suppression of blur are examples of applications.

In an exemplary embodiment for noise reduction, the subband enhancement can be implemented by a thresholding operator that sets to zero or decreases the amplitude of all coefficients below a threshold value that is proportional to the noise variance. In another exemplary embodiment, coefficients are selected among local maxima of the subband coefficients and the selected coefficients are set to zero. It yet another exemplary embodiment, the module 102 implements a block thresholding method that attenuates the coefficient values depending upon the amplitude of neighboring subband coefficients. In yet another embodiment, the module 102 enhances the high frequencies of the signal by combining a thresholding operator and an amplification operator to amplify coefficients above a threshold.

The system of FIG. 1 further includes a twice oversampled inverse subband filter (TOISF) bank 103 receiving the K enhanced subband signals $(\overline{F}_k)_{1 \le k \le K}$ and outputting the enhanced signal $\overline{S}$ by inverting the twice oversampled subband transform.

A TOSF filter bank is implemented with a cascade of filtering and subsampling using perfect reconstruction one-dimensional filters of the same kind as used in a critically-sampled filter bank (see, e.g., M. Vetterli and C. Herley, "Wavelets and filter banks, theory and design", IEEE Transactions on Signal Processing, vol. 40, no. 9, pp. 2207-2232, September 1992 A two-channel critically-sampled perfect reconstruction filter bank is known to be defined by two pairs of filters $\{h_1[n], g_1[n]\}$ and $\{h_2[n], g_2[n]\}$ whose z-transforms satisfy:

$$\hat{h}_1(-z).\hat{h}_2(z)+\hat{g}_1(-z).\hat{g}_2(z)=0$$

and $$\hat{h}_1(z).\hat{h}_2(z)+\hat{g}_1(z).\hat{g}_2(z)=2.$$

The filters $h_1$ and $h_2$ are low-pass filters whereas $g_1$ and $g_2$ are high-pass filters. Cohen-Daubechies 7/9 and 5/3 biorthogonal perfect reconstruction filters are examples of finite impulse response filters. Conjugate mirror filters are examples of perfect reconstruction filters for which $h_2[n]=h_1[-n]$ and $g_2[n]=g_1[-n]$. Daubechies orthogonal filters are examples of conjugate mirror filters. Haar filters are yet another example of conjugate mirror filter, in which $\hat{h}_1(z)=(1+z)/\sqrt{2}$, $\hat{g}_1(z)=(1-z)/\sqrt{2}$, $\hat{h}_2(z)=(1+z^{-1})/\sqrt{2}$ and $\hat{g}_2(z)=(1-z^{-1})/\sqrt{2}$.

Figure 2:
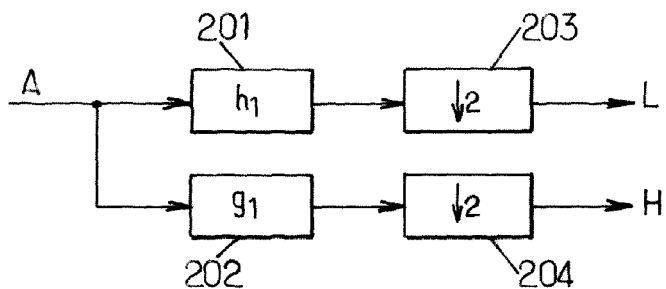
FIGS. 2 and 3 are block diagrams of a conventional critically-sampled filtering unit for subband decomposition of a one-dimensional signal and of a corresponding inverse filtering unit for signal reconstruction.

FIG. 2 illustrates an exemplary configuration of a conventional critically-sampled subband filtering unit for one-dimensional signals. The input one-dimensional signal A[n] is convolved with the one-dimensional low-pass filter 201 whose impulse response is $h_1[n]$. A downsampler 203 receives the low-pass component from filter 201 and outputs one sample out of two received samples, $A*h_1[2n]$. Similarly, the input signal A[n] is convolved with the high-pass filter 202 whose impulse response is $g_1[n]$, and a downsampler 204 outputs the even samples $A*g_1[2n]$. Each of the resulting low frequency signal $L[n]=A*h_1[2n]$ and high frequency signal $H[n]=A*g_1[2n]$ have twice less samples than A[n].

Figure 3:
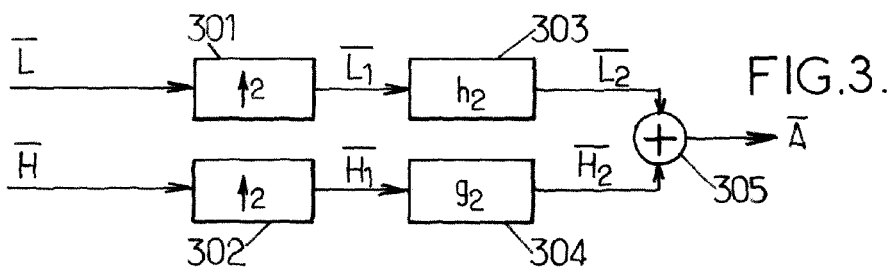

FIG. 3 illustrates an exemplary configuration of a conventional critically-sampled subband inverse filtering unit for one-dimensional signals. An upsampler 301 inserts zeros in between each sample of an input low frequency signal $\overline{L}[n]$, i.e. outputs $\overline{L}_1[n]=\overline{L}[n/2]$ if n is even and $\overline{L}_1[n]=0$ if n is odd. A filter 303 performs a convolution of $\overline{L}_1[n]$ with $h_2[n]$ and outputs $\overline{L}_2[n]=\overline{L}_1*h_2[n]$. Similarly, an upsampler 302 inserts zeros in between each sample of an input high frequency signal $\overline{H}[n]$, i.e. outputs $\overline{H}_1[n]=\overline{H}[n/2]$ if n is even and $\overline{H}_1[n]=0$ if n is odd. A filter 304 performs a convolution of $\overline{H}_1[n]$ with $g_2[n]$ and outputs $\overline{H}_2[n]=\overline{H}_1*g_2[n]$. An adder 305 produces the output signal $\overline{A}[n]$ of the inverse filtering unit as $\overline{A}[n]=\overline{L}_2[n]+\overline{H}_2[n]$.

With perfect reconstruction filters, if the input signals in FIG. 3 are equal to the output signals in FIG. 2, i.e. if $\overline{L}=L$ and $\overline{H}=H$, then the output of FIG. 3 is equal to the input of FIG. 2, up to computational precision: $\overline{A}=A$. This is a perfect signal reconstruction property.

Many possibilities are known to those skilled in the art for the choice of perfect reconstruction filters and efficient algorithms to implement the convolutions in filters 201, 202, 303 and 304, including lifting schemes, with appropriate boundary treatments of convolutions at the signal extremities, while retaining the perfect signal reconstruction property.

Figure 4:
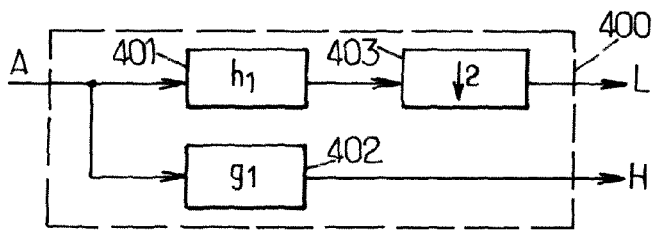
FIGS. 4 and 5 are block diagrams of exemplary configurations of a twice oversampled subband filtering unit for decomposition of a one-dimensional signal and of a corresponding inverse filtering unit for signal reconstruction.

FIG. 4 illustrates an exemplary configuration of a TOSF filtering unit 400 usable in the present invention. It includes a low-pass filter 401 for convolving the input signal A[n] with the one-dimensional low-pass filter $h_1[n]$, and a downsampler 403 receiving the low-pass component from filter 401 and outputting $L[n]=A*h_1[2n]$. Filter 401 and downsampler 403 can be of the same type as the low-pass filter 201 and downsampler 203 described with reference to FIG. 2. The input signal A[n] is also convolved in a high-pass filter 402 having an impulse response $g_1[n]$, which may be identical to the above-described high-pass filter 202. However, no downsampling is applied to the output signal $H[n]=A*g_1[n]$ of filter 402.

The resulting low-pass signal $L[n]=A*h_1[2n]$ has approximately twice fewer samples than A[n], up to one coefficient that depends upon known border treatments, whereas the high-pass signal $H[n]=A*g_1[n]$ has approximately as many samples as A[n], up to one coefficient that also depends upon border treatments.

Figure 5:
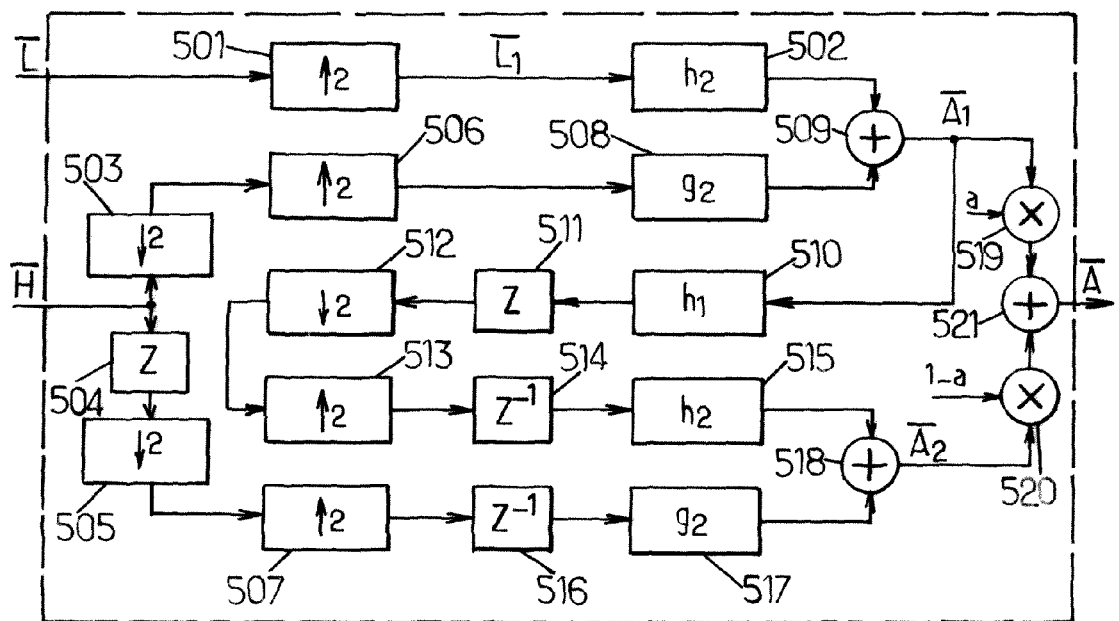

FIG. 5 illustrates an exemplary configuration of a TOISF filtering unit 500 usable in the present invention. Its low frequency input signal $\overline{L}[n]$ is processed by an upsampler 501 which may be identical to the above-described upsampler 301. The upsampler 501 outputs $\overline{L}_1[n]\overline{L}[n/2]$ if n is even and $\overline{L}_1[n]=0$ if n is odd. A filter 502, which may be identical to the above-described filter 301, performs a convolution of $\bar{L}_1[n]$ with $h_2[n]$ and outputs $\bar{L}_2[n]=\bar{L}_1*h_2[n]$.

The high frequency input signal $\bar{H}[n]$ of the TOISF unit 500 is processed by two downsamplers 503, 505. Downsampler 503 outputs the even samples of $\bar{H}[n]$, while downsampler 505 outputs the odd samples, the samples submitted to downsampler 505 being previously shifted by −1 by the shift module 504. Zeros are inserted by an upsampler 506 between the even samples output by downsampler 503, while zeros are inserted by another upsampler 507 between the odd samples output by downsampler 505. A filter 508 calculates the convolution between the output of the even upsampler 506 and $g_2[n]$. An adder 509 receives the respective outputs of filters 502 and 508 to produce a partially reconstructed signal $\bar{A}_1$.

A further filter 510 calculates the convolution between the partially reconstructed signal $\bar{A}_1$ and $h_1[n]$. The output of filter 510 is shifted by −1 by shifting module 511 and downsampled by a factor 2 by a downsampler 512. Zeroes are then inserted every two samples of the output of downsampler 512 by an upsampler 513 whose output is shifted by +1 by a shifting module 514 before being applied to a further filter 515 whose impulse response is $h_2[n]$. The output of the upsampler 507 is shifted by +1 by the shift module 516, and another filter 517 calculates the convolution between the output of the shift module 516 and $g_2[n]$. A further adder 518 receives the respective outputs of filters 515 and 517 to produce a second partially reconstructed signal $\bar{A}_2$.

The reconstructed output signal $\bar{A}$ is an average of the two partially reconstructed signals $\bar{A}_1$, $\bar{A}_2$ weighted by a mixing weight a such that 0<a<1:

$\bar{A}=a.\bar{A}_1+(1-a).\bar{A}_2$

This combination is illustrated in FIG. 5 by the multipliers 519-520 and the adder 521. The mixing weight a should not be equal to 1 but can otherwise be chosen arbitrarily between 0 and 1. In an embodiment, a is taken as equal to ½. This TOISF filtering has a perfect reconstruction property, which means that if the input signals $\bar{L}$, $\bar{H}$ in FIG. 5 are equal to the output signals L, H in FIG. 4, ($\bar{L}$=L and $\bar{H}$=H), then the output signal $\bar{A}$ of FIG. 5 is equal to the input signal A of FIG. 4: $\bar{A}$=A.

The operations in FIG. 5 can be reconfigured more efficiently by means of well known filtering techniques. In particular, it is readily apparent that successive filtering and subbsampling operations can be concatenated into single steps.

Figure 6:
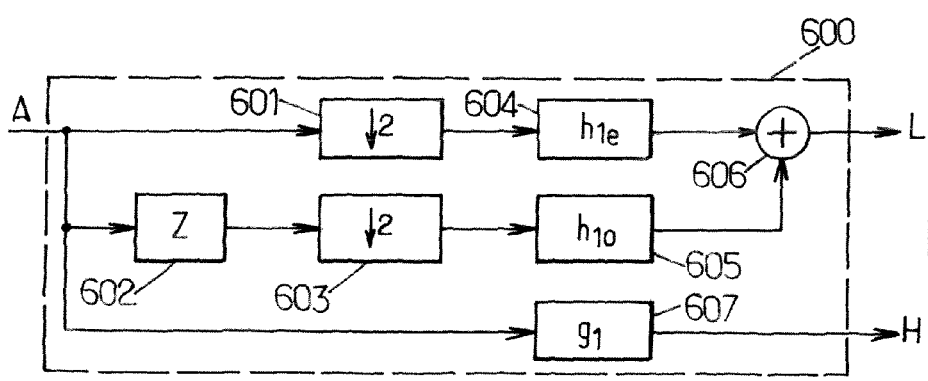
FIGS. 6 and 7 are block diagrams of polyphase configurations for a twice oversampled subband filtering unit for decomposition of a one-dimensional signal and for a corresponding inverse filtering unit for signal reconstruction.
Figure 7:
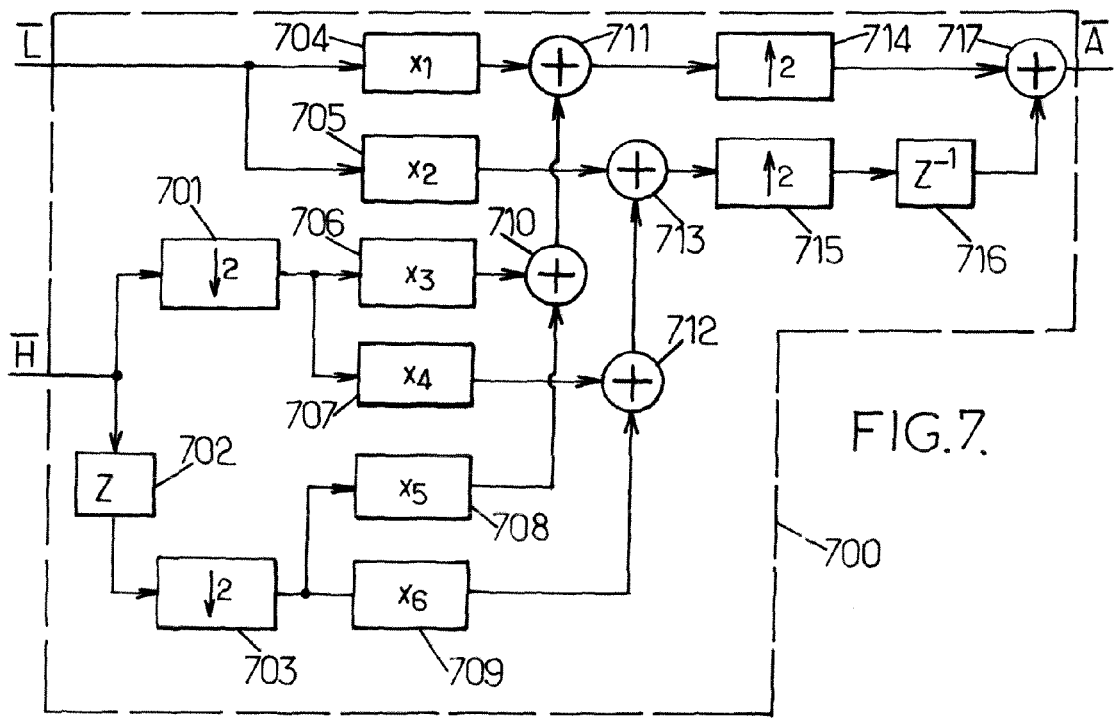

FIGS. 6-7 illustrate alternative embodiments of TOSF and TOISF filtering units usable in the present invention, based on polyphase filtering.

In the TOSF unit 600 of FIG. 6, the even and odd samples of the input signal A are separated by the downsamplers 601, 603, the samples submitted to downsampler 603 being previously shifted by −1 by the shift module 602. A first low-pass filter 604 calculates the convolution between the even samples of A, extracted by downsampler 601, and the even components $h_{1e}[n]=h_1[2n]$ of the low-pass filter $h_1$. A second low-pass filter 605 calculates the convolution between the odd samples of A, extracted by downsampler 603, and the odd components $h_{1o}[n]=h_1[2n-1]$ of the low-pass filter $h_1$. An adder 606 receives the respective outputs of filters 604 and 605 to produce the low-frequency signal L. The high frequency signal H is obtained by processing the input signal A in the high-pass filter 607 having $g_1[n]$ as an impulse response, with no downsampling.

The TOISF unit 700 of FIG. 7 includes perfect reconstruction polyphase filters 704-709 having respective impulse responses $x_1[n]$-$x_6[n]$ computed from the perfect reconstruction filters and the mixing weight a. In a preferred embodiment, these filters are defined by:

$\hat{x}_1(z) = a.\hat{h}_{2e}(z)+(1-a).z^{-1}.\hat{h}_{2o}(z).\hat{h}'_o(z)$ $\hat{x}_2(z) = a.\hat{h}_{2o}(z)+(1-a).\hat{h}_{2e}(z).\hat{h}_{2e}(z).\hat{h}'_o(z)$ $\hat{x}_3(z) = a.\hat{g}_{2e}(z)+(1-a)^{-1}.\hat{h}^{2o}(z).\hat{g}'_o(z)$ $\hat{x}_4(z) = a.\hat{g}_{2o}(z)+(1-a).\hat{h}_{2e}(z).\hat{g}'_o(z)$ $\hat{x}_5(z) = (1-a).z^{-1}.\hat{g}_{2o}(z)$ $\hat{x}_6(z) = (1-a).\hat{g}_{2e}(z)$ In the above expressions, $\hat{h}_{2e}(z)$ and $\hat{h}_{2o}(z)$ represent the z-transforms of the even and odd components $h_{2e}$ and $h_{2o}$ of the inverse filter $h_2$, and $\hat{g}_{2e}(z)$ and $\hat{g}_{2o}(z)$ represent the z-transforms of the even and odd components $g_{2e}$ and $g_{2o}$ of the inverse filter $g_2$. Moreover, in the expressions of $\hat{x}_1(z)$ and $\hat{x}_2(z)$, $\hat{h}'_o(z)$ represents the z-transform of the odd component $h'_o$ of $h'=h_2*h_1$, and in the expression of $\hat{x}_3(z)$ and $\hat{x}_4(z)$, $\hat{g}'_o(z)$ represents the z-transform of the odd component $g'_o$ of $g'=g_2*h_1$:

$$\hat{h}'_o(z^2) = \frac{z}{2} \cdot (\hat{h}_2(z)\cdot\hat{h}_1(z) - \hat{h}_2(-z)\cdot\hat{h}_1(-z))$$

$$\hat{g}'_o(z^2) = \frac{z}{2} \cdot (\hat{g}_2(z)\cdot\hat{h}_1(z) - \hat{g}_2(-z)\cdot\hat{h}_1(-z))$$

In the particular case of Haar filters, the resulting perfect reconstruction polyphase filters can be chosen as:

$$\hat{x}_1(z) = \frac{1}{2\sqrt{2}} \cdot (1+a+(1-a)\cdot z^{-1}),$$

$$\hat{x}_2(z) = \frac{1}{2\sqrt{2}} \cdot (1+a+(1-a)\cdot z),$$

$$\hat{x}_3(z) = \frac{1}{2\sqrt{2}} \cdot (1+a-(1-a)\cdot z^{-1}),$$

$$\hat{x}_4(z) = \frac{1}{2\sqrt{2}} \cdot (-(1+a)+(1-a)\cdot z),$$

$$\hat{x}_5(z) = -\frac{1-a}{\sqrt{2}}\cdot z^{-1}, \hat{x}_6(z) = \frac{1-a}{\sqrt{2}}\cdot z$$

In a preferred embodiment, a mixing weight a=½ is chosen.

In the TOISF unit 700 of FIG. 7, the polyphase components of the high-pass input signal $\bar{H}$ are separated by the downsamplers 701, 703, the samples submitted to downsampler 703 being previously shifted by −1 by the shift module 702. In parallel, the low-pass signal $\bar{L}$ is input to filters 704 and 705 which convolve it by $x_1$ and $x_2$, respectively. The even samples of $\bar{H}$, output by downsampler 701, are input to filters 706 and 707 which convolve them by $x_3$ and $x_4$, respectively. The odd samples of $\bar{H}$, output by downsampler 703, are input to filters 708 and 709 which convolve them by $x_5$ and $x_6$, respectively.

An adder 710 receives the respective outputs of filters 706 and 708, and its output is further added with the output of filter 704 (adder 711) to produce the even components of the output signal $\bar{A}$. Likewise, an adder 712 receives the respective outputs of filters 707 and 709, and its output is further added with the output of filter 705 (adder 713) to produce the odd components of the output signal $\bar{A}$. The even and odd components of the output signal $\overline{A}$ are recombined by upsampling the even and odd components by a factor 2 (upsamplers 714, 715), shifting by +1 the upsampled odd components (shift module 716) and adding the outputs of the upsampler 714 and of the shift module 716 (adder 717), which yields the reconstructed signal $\overline{A}$.

A TOSF filter bank 101, as used in the enhancement system of FIG. 1, can be obtained from any critically-sampled filter bank by replacing the critically-sampled subband filtering modules of FIG. 2 by TOSF units 400, 600 as shown in either of FIG. 4 and FIG. 6. The TOISF filter bank 103 is obtained from the corresponding critically-sampled inverse filter bank by replacing the critically-sampled inverse filtering modules of FIG. 3 by TOISF units 500, 700 as shown in FIG. 5 or FIG. 7. A TOSF filter bank may be regarded as a binary tree where each node is a TOSF unit that splits a signal into low- and high-frequency signals. Each binary tree corresponds to a particular wavelet packet transform.

Figure 8:
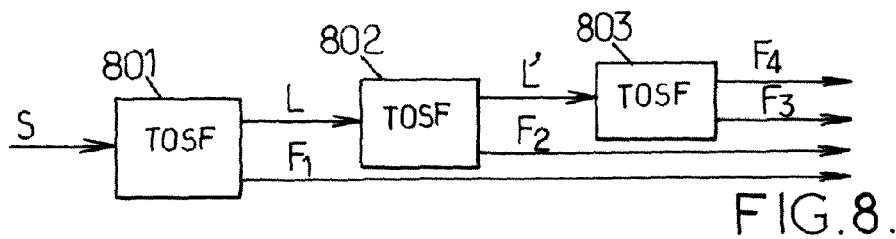
FIGS. 8 and 9 are block diagrams of exemplary filter banks for multiscale subband decomposition and reconstruction of one-dimensional signals.

FIG. 8 shows an exemplary embodiment of a TOSF filter bank for a one-dimensional input signal S[n] (d=1), in a case where the wavelet packet transform is a wavelet transform over three scales (J=3). The filter bank has J=3 modules 801, 802, 803 each consisting of $2^d-1=1$ TOSF filtering unit which may be designed according to either of FIG. 4 and FIG. 6. The first TOSF unit 801 splits the input signal S into a low-frequency signal L having twice fewer samples than S and a high-frequency signal $H=F_1$ having the same number of samples as S. The low-frequency signal L is then decomposed by the next TOSF unit 802 that is identical to 801. The TOSF unit 802 outputs a low-frequency signal and a high-frequency signal $F_2$. The low-frequency signal from the TOSF unit 802 is in turn decomposed by the last TOSF module 803, also identical to 801, into a high-frequency signal $F_3$ and a low-frequency signal $F_4$. The lowest-frequency output component $F_4$ has about $2^{d \cdot J}=8$ times fewer samples than S; the highest-frequency output component $F_1$ has the same number of samples as S; and the other output components $F_2$ and $F_3$ respectively have oversampling ratios of 4 and 2 compared to $F_4$.

Figure 9:
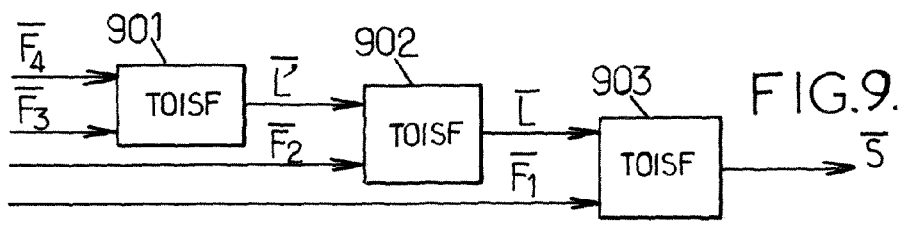

FIG. 9 shows an exemplary embodiment of a TOISF filter bank that inverts the TOSF filter bank of FIG. 8. The TOISF filter bank receives the K=J+1=4 subband signals $\overline{F}_1$-$\overline{F}_4$ corresponding to the four components $F_1$-$F_4$ from the TOSF filter bank after processing in the enhancement module 102 of FIG. 1 (K=4 in this case). It has J=3 modules 901, 902, 903 each consisting of $2^d-1=1$ TOISF unit of the type shown in FIG. 5 or 7. The TOISF units 901, 902 and 903 are the inverses of the TOSF units 803, 802 and 801, respectively. The TOISF unit 901 takes in input the low-frequency signal $\overline{F}_4$ and the high-frequency signal $\overline{F}_3$ to reconstruct a signal that is the low-frequency signal $\overline{L}'$ input to the TOISF unit 902, together with the high-frequency signal $\overline{F}_2$. The TOISF unit 902 outputs a reconstructed signal which, in turn, is the low-frequency signal $\overline{L}$ input to the TOISF unit 903 together with the high-frequency signal $\overline{F}_1$. The TOISF unit 903 outputs the reconstructed signal $\overline{S}$.

Figure 10:
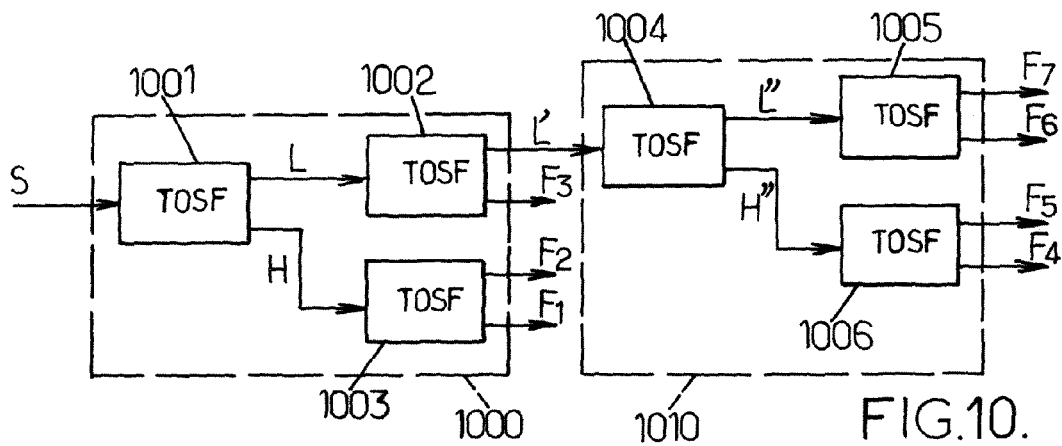
FIGS. 10 and 11 are block diagrams of exemplary filter banks for multiscale subband decomposition and reconstruction of a two-dimensional image.

FIG. 10 shows an exemplary embodiment of a TOSF filter bank for a two-dimensional image signal $S[n_1, n_2]$ (d=2), in a case where the wavelet packet transform is a wavelet transform over two scales (J=2). The integers $n_1$ and $n_2$ are respectively row and column indexes. The filter bank has J=2 modules 1000, 1010, hereafter referred to as "2D TOSF modules", each consisting of $2^d-1=3$ TOSF units 1001-1003, 1004-1006 which may be designed according to either of FIG. 4 and FIG. 6.

In the filter bank of FIG. 10, the input image S is supplied to the 2D TOSF module 1000 consisting of the three TOSF units 1001, 1002, 1003. The first TOSF unit 1001 applies the twice oversampled subband filtering to each row of the input image S. For each row, the TOSF unit 1001 outputs a low-frequency signal L having twice fewer samples than S, and a high-frequency signal H having as many samples as S. The low-frequency signal L for all rows defines a low-frequency image output that has as many rows as S, but twice fewer columns. Each column of L is an input signal for the TOSF unit 1002. The high-frequency signal H for all rows defines a high-frequency image output that has as many rows and columns as S. Each column of H is an input signal for the TOSF unit 1003.

For each column of H, the TOSF unit 1003 outputs a low-frequency signal having twice fewer samples than S and a high-frequency signal having as many samples as S. The high-frequency signal for all columns defines a subband image output $F_1$ having as many rows and columns as S. The low-frequency signal from the TOSF unit 1003 for all columns defines a subband image output $F_2$ having as many columns as the input image S, but twice fewer rows. The TOSF unit 1002 is identical to the TOSF unit 1003. Its high-frequency image output, having as many rows as S but twice fewer columns, is one of the subband components $F_3$ of the input image S.

The low-frequency image output L' of the TOSF unit 1002 has twice fewer rows and columns than S. It is further decomposed by another 2D TOSF module 1010 having the same structure as the above-described 2D TOSF module 1000, with the three TOSF units 1004, 1005, 1006. The TOSF unit 1004 again performs a twice oversampled subband filtering along rows to produce a low-frequency image output L" and high-frequency image output H". The two TOSF units 1005, 1006 are provided to further decompose the respective image outputs L", H" from unit 1004. The high- and low-frequency image outputs from unit 1006 form two respective subband components $F_4$, $F_5$ of the input image S, with $F_4$ having twice fewer rows and columns than S, and $F_5$ having twice fewer columns and four times fewer rows than the input image S. The high- and low-frequency image outputs from unit 1006 also form two respective subband components $F_6$, $F_7$ of the input image S, with $F_6$ having twice fewer rows and four times fewer columns than S, and $F_7$ having four times fewer rows and columns than the input image S.

The lowest-frequency output component $F_7$ in the example of FIG. 10 has about $2^{d \cdot J}=16$ times fewer samples than S; the highest-frequency output component $F_1$ has the same number of samples as S; the output components $F_2$-$F_3$ have an oversampling ratio of 8 compared to $F_7$; the output component $F_4$ has an oversampling ratio of 4 compared to $F_7$; and the output components $F_5$-$F_6$ have an oversampling ratio of 2 compared to $F_7$.

Figure 11:
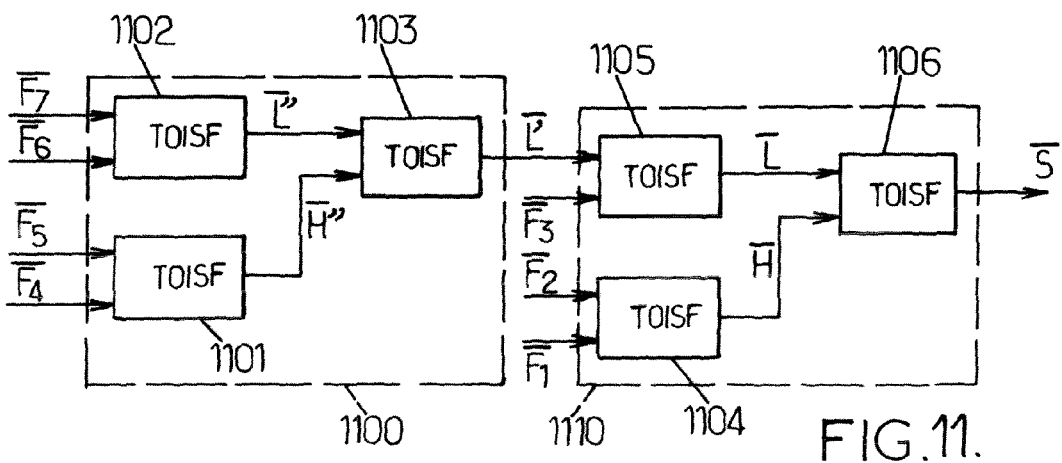

FIG. 11 shows an exemplary embodiment of a TOISF filter bank that inverts the TOSF filter bank of FIG. 10. The TOISF filter bank receives the K=3J+1=7 subband signals $\overline{F}_1$-$\overline{F}_7$ corresponding to the seven components $F_1$-$F_7$ from the TOSF filter bank after processing in the enhancement module 102 of FIG. 1 (K=7 in this case). It has J=2 modules 1100, 1110, hereafter referred to as "2D TOISF modules", each consisting of $2^d-1=3$ TOISF units 1101-1103, 1104-1106 which may be of the type shown in FIG. 5 or 7. The TOISF units 1101, 1102, 1103, 1104, 1105 and 1106 are the inverses of the TOSF units 1006, 1005, 1004, 1003, 1002 and 1001, respectively. In other words, the 2D TOISF module 1100 is the inverse of the 2D TOSF module 1010 of FIG. 10, while the 2D TOISF module 1100 is the inverse of the 2D TOSF module 1000 of FIG. 10.

The TOISF unit 1102 takes in input the low-frequency signal $\overline{F}_7$ and the high-frequency signal $\overline{F}_6$ to reconstruct a signal that is the low-frequency signal $\overline{L}''$ input to the TOISF unit 1103. The TOISF unit 1101 takes in input the high-frequency signal $\overline{F}_4$ and the low-frequency signal $\overline{F}_5$ to reconstruct a signal that is the high-frequency signal $\overline{H}''$ input to the TOISF unit 1103, together with the low-frequency signal $\overline{L}''$ from the TOISF unit 1102. The TOISF unit 1103 outputs a low-frequency reconstructed signal $\overline{L}'$ which is the enhanced replica of the low-frequency image L' passed between the 2D TOSF units 1000, 1100 in FIG. 10. This low-frequency reconstructed signal $\overline{L}'$ and the three remaining components $\overline{F}_1$-$\overline{F}_3$ of the input of the TOISF filter bank are supplied to the second 2D TOISF module 1100.

The TOISF unit 1105 takes in input the low-frequency reconstructed signal $\overline{L}'$ and the high-frequency signal $\overline{F}_3$ to reconstruct a signal that is the low-frequency signal $\overline{L}$ input to the TOISF unit 1106. The TOISF unit 1104 takes in input the high-frequency signal $\overline{F}_1$ and the low-frequency signal $\overline{F}_2$ to reconstruct a signal that is the high-frequency signal $\overline{H}$ input to the TOISF unit 1106, together with the low-frequency signal $\overline{L}$ from the TOISF unit 1105. The TOISF unit 1106 outputs the reconstructed signal $\overline{S}$.

Figure 12:
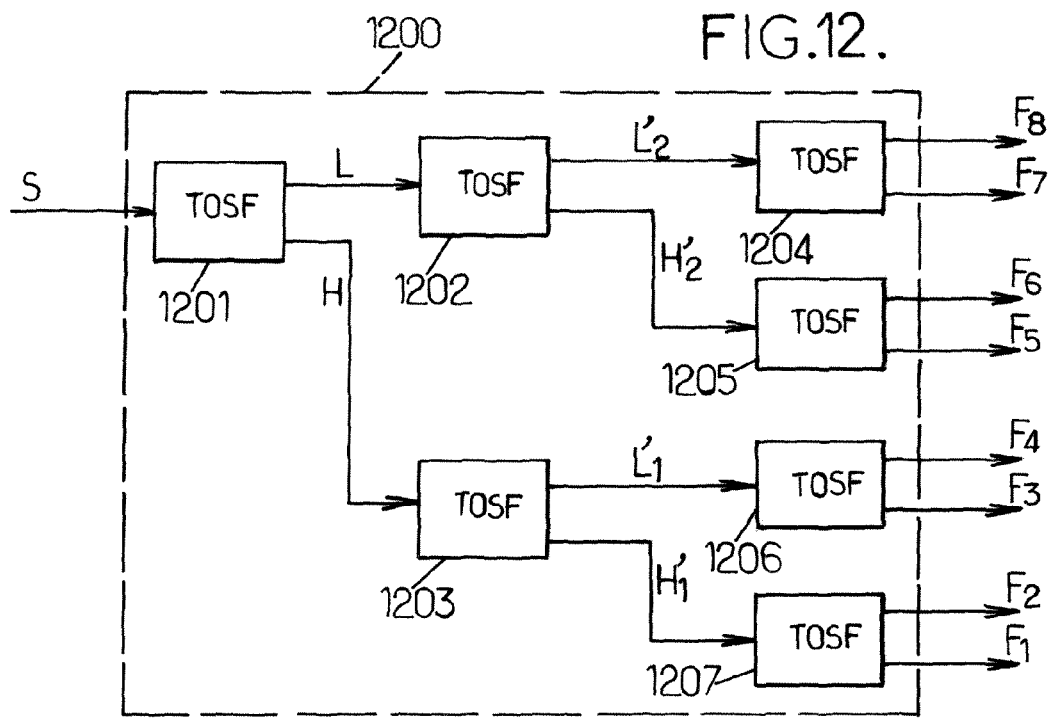
FIGS. 12 and 13 are block diagrams of exemplary filter banks for multiscale subband decomposition and reconstruction of a three-dimensional video.

FIG. 12 shows an exemplary embodiment of a TOSF filter bank for a three-dimensional video signal $S[n_1, n_2, n_3]$ (d=3), in a case where the wavelet packet transform is a wavelet transform over one scale (J=1). To simplify explanations, the integers $n_1$, $n_2$ and $n_3$ are respectively referred to as row, column and time indexes (it may be noted that $n_3$ may not correspond to a time parameter when the input signal is other than a video). The filter bank has J=1 module 1200, hereafter referred to as "3D TOSF module", consisting of $2^d-1=7$ TOSF units 1201-1207 which may be designed according to either of FIG. 4 and FIG. 6.

In the filter bank of FIG. 12, the input video signal S is supplied to a 3D TOSF module 1200 consisting of three TOSF units 1201, 1202, 1203 which may be designed according to either of FIG. 4 and FIG. 6. The TOSF unit 1201 applies the twice oversampled subband filtering to each row of the input signal S. For each row, the TOSF unit 1201 outputs a low-frequency signal L having twice fewer samples than S, and a high-frequency signal H having as many samples as S. The low-frequency signal L for all rows defines a low-frequency signal output which is supplied to the TOSF unit 1202. The high-frequency signal H for all rows defines a high-frequency signal output which is supplied to the TOSF unit 1203. The TOSF units 1202, 1203 apply the twice oversampled subband filtering to each column of L and H, respectively. For each column of H(L), the unit 1203 (1202) outputs a low-frequency signal $L'_1$ ($L'_2$) having twice fewer samples and a high-frequency signal $H'_1$ ($H'_2$) having as many samples as H (L). The four signals $L'_2$, $H'_2$, $L'_1$ and $H'_1$ are further decomposed along the time dimension by the respective TOSF units 1204, 1205, 1206 and 1207 to provide the subband components $F_1$-$F_8$.

The lowest-frequency output component $F_8$ in the example of FIG. 12 has about $2^{d \cdot J}=8$ times fewer samples than S; the highest-frequency output component $F_1$ has the same number of samples as S; the output components $F_2$-$F_3$ and $F_5$ have an oversampling ratio of 4 compared to $F_8$; and the output components $F_4$ and $F_6$-$F_7$ have an oversampling ratio of 2 compared to $F_8$.

Figure 13:
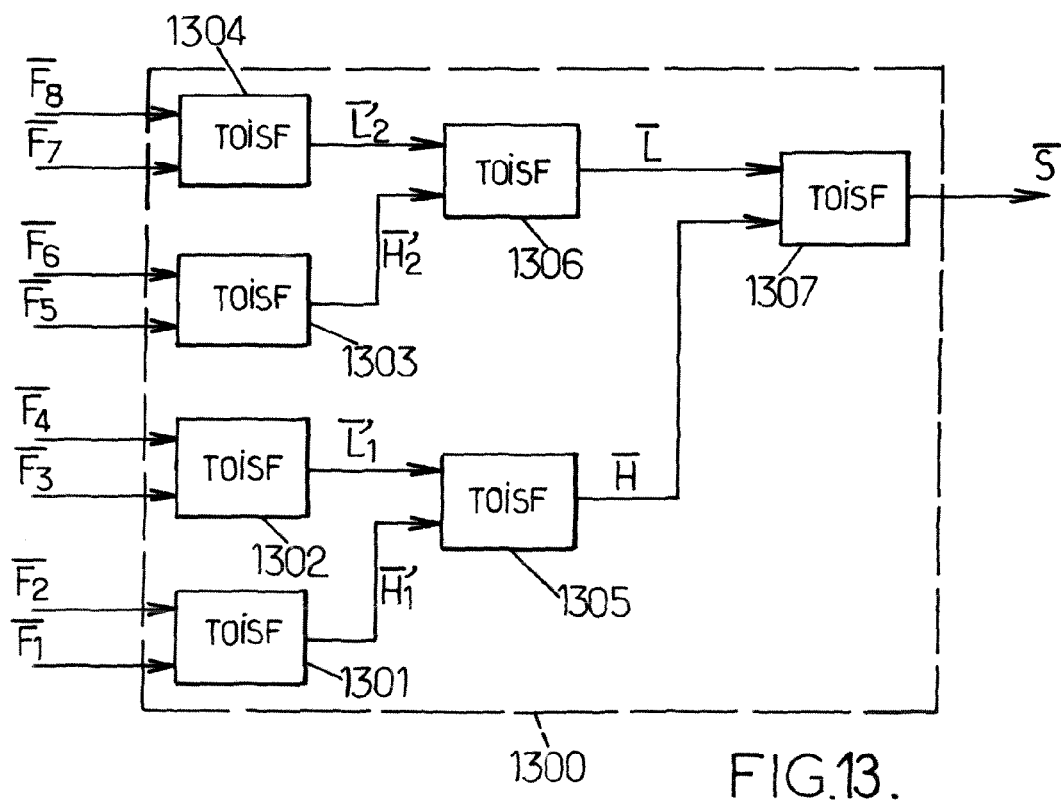

FIG. 13 shows an exemplary embodiment of a TOISF filter bank that inverts the TOSF filter bank of FIG. 12. The TOISF filter bank receives the K=7J+1=8 subband signals $\overline{F}_1$-$\overline{F}_8$ corresponding to the eight components $F_1$-$F_8$ from the TOSF filter bank after processing in the enhancement module 102 of FIG. 1 (K=8 in this case). It has J=1 module 1300, hereafter referred to as "3D TOISF module", consisting of $2^d-1=7$ TOISF units 1301-1307 which may be of the type shown in FIG. 5 or 7. The TOISF units 1301, 1302, 1303, 1304, 1305, 1306 and 1307 are the inverses of the TOSF units 1207, 1206, 1205, 1204, 1203, 1202 and 1201, respectively. In other words, the 3D TOISF module 1300 is the inverse of the 3D TOSF module 1200 of FIG. 12.

The TOISF unit 1302 takes in input the low-frequency signal $\overline{F}_4$ and the high-frequency signal $\overline{F}_3$ to reconstruct a signal that is the low-frequency signal $\overline{L}'_1$ input to the TOISF unit 1305. The TOISF unit 1301 takes in input the high-frequency signal $\overline{F}_2$ and the low-frequency signal $\overline{F}_1$ to reconstruct a signal that is the high-frequency signal $\overline{H}'_1$ input to the TOISF unit 1305, together with the low-frequency signal $\overline{L}'_1$ from the TOISF unit 1302. The TOISF unit 1304 takes in input the low-frequency signal $\overline{F}_8$ and the high-frequency signal $\overline{F}_7$ to reconstruct a signal that is the low-frequency signal $\overline{L}'_2$ input to the TOISF unit 1306. The TOISF unit 1303 takes in input the high-frequency signal $\overline{F}_6$ and the low-frequency signal $\overline{F}_5$ to reconstruct a signal that is the high-frequency signal $\overline{H}'_2$ input to the TOISF unit 1303, together with the low-frequency signal $\overline{L}'_2$ from the TOISF unit 1304. The TOISF units 1305, 1306 output respective high- and low frequency reconstructed signals $\overline{H}$, $\overline{L}$ which are supplied to the final TOISF unit 1307 of the 3D TOISF module 1300. The TOISF unit 1307 outputs the reconstructed video signal $\overline{S}$.

The diagrams of FIGS. 8-13 are readily generalized to more than one scale and/or to more than three dimensions of the input signal S. For a given signal dimension d, an additional scale J can be provided by further decomposing the lowest-frequency component of the decomposition at scale J−1 ($F_4$ in FIG. 8, $F_7$ in FIG. 10, $F_8$ in FIG. 12) by means of an additional dD TOSF module (a 1D TOSF module consisting of just one TOSF unit as exemplified in FIG. 4 or 6). On the reconstruction side, a further dD TOISF module is inserted at the input end of the filter bank to add one scale J (a 1D TOISF module consisting of just one TOISF unit as exemplified in FIG. 5 or 7). Each TOSF or TOISF module is organized as a binary tree having d levels. One signal dimension is added by simply adding one level to the binary tree.

For a d-dimensional signal decomposed with a wavelet transform up to a scale J:
 a dD TOSF (TOISF) module has $2^d$ outputs (inputs);
 the number of TOSF (TOISF) units in each dD TOSF (TOISF) module is $2^d-1$;
 the number of dD TOSF modules for decomposition is J;
 the number of 3D TOISF modules for reconstruction is also J; and
 the number of decomposed signal components (outputs of the TOSF filter bank 101/inputs of the TOISF filter bank 103) is $K=(2^d-1).J+1$.

Various subband filtering modifications can be applied to the above-described filter banks. For example, the TOSF units used in the TOSF filter bank 101 can be implemented with different filters $h_i$, $g_i$ at different levels of the decomposition tree. In such a case, the corresponding TOISF filtering must use the corresponding pairs of perfect reconstruction filters so that $\{h_1, g_1\}$ and $\{h_2, g_2\}$ have a perfect reconstruction property.

For videos (d=3), it may be worthwhile to use shorter filters along the time dimension than along the spatial directions.

Other oversampled wavelet packet subband transforms that are not wavelet transforms can also be implemented in the TOSF filter bank 101 and in the TOISF filter bank 103. At a scale J, the TOSF filter bank 101 implementing an oversampled wavelet packet subband transform is organized a tree of TOSF filtering modules of depth J. Each level j in the tree has one module in the particular case of the wavelet transform (the J modules being cascaded as described above), or more than one module in the generalized wavelet packet case. The TOSF module at the root of the tree decomposes the input signal S while each TOSF module beyond that sub-decomposes a component coming from a previous TOSF module that is not necessarily the low-frequency component. Symmetrically, the TOISF filter bank 103 reconstructs a signal by inverting the TOSF modules of the filter bank 101 with TOISF modules organized in an equivalent tree structure of the inverse filter bank of depth J.

Figure 14:
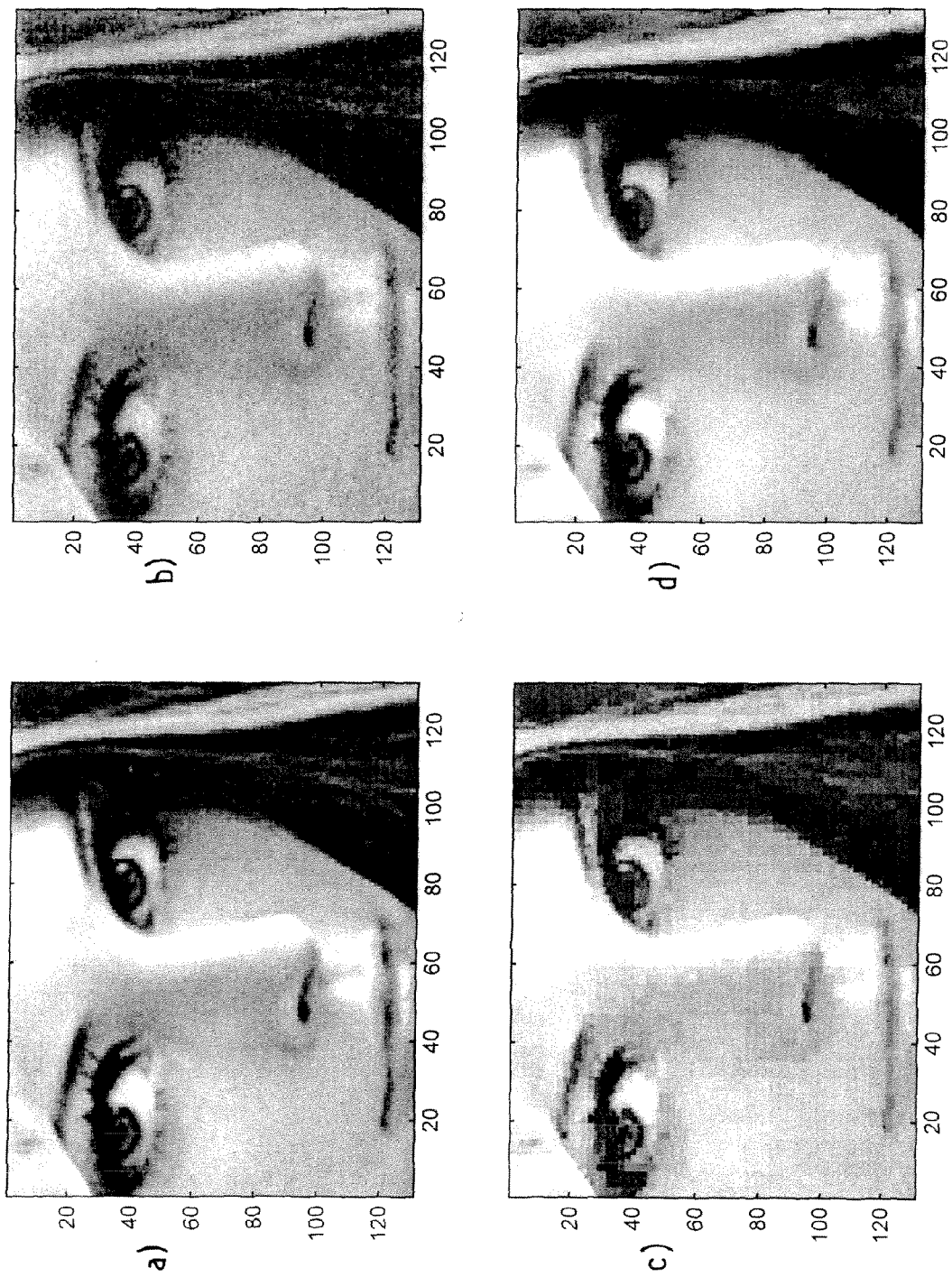
FIG. 14 shows (a) an example of original image, (b) the same image contaminated by Gaussian additive white noise, (c) an image obtained by thresholding orthogonal Haar coefficients on 4 scales and (d) an image obtained by thresholding twice oversampled Haar coefficients.

FIG. 14 shows results of 2D image enhancement computed with the above-described filter banks, compared with a conventional image enhancement computed with a critically-sampled filter bank. FIG. 14(a) shows an original image. FIG. 14(b) shows the same image which has been artificially corrupted by a Gaussian additive white noise with a PSNR 28.46 dB. FIG. 14(d) shows an image obtained with an enhancement system using TOSF and TOISF filter banks implementing a twice oversampled two-dimensional wavelet transform over J=4 scales, using Haar filters, The subband enhancement is implemented with a thresholding operation setting to zero all subband coefficients whose amplitude are larger than 3 times the standard deviation of the noise. The image of FIG. 14(c) is obtained by replacing the twice oversampled Haar wavelet transform by an orthogonal Haar wavelet transform implemented with critically-sampled subband filtering using the same Haar filters. It has a PSNR of 28.96 dB with visible block or grid artifacts that have virtually disappeared with the twice oversampled Haar wavelet transform for which the PSNR is 31.16 dB.

The invention claimed is:

1. A filter bank for subband decomposition of an input signal into a number K of subband components for processing, comprising a filtering module for transforming the input signal into $2^d$ components including a low-frequency component and $2^d-1$ higher-frequency components, d being an integer at least equal to 1 representing a dimension of the input signal,
wherein said $2^d-1$ higher-frequency components are oversampled compared to said low-frequency component,
wherein each filtering module is made of $2^d-1$ filtering units arranged in a binary tree having d levels, wherein, for $1 \leq i \leq d$, the i-th level in the tree has $2^{i-1}$ filtering units each receiving a respective input signal and producing a respective output low-frequency signal and a respective output high-frequency signal oversampled compared to said respective output low-frequency signal,
wherein the input signal of said filtering module is the input signal of the filtering unit of the first level in the tree, wherein, for any i >1, the output low-frequency and high-frequency signals from the $2^{i-2}$ filtering units of the (i−1)-th level in the tree are the respective input signals of the $2^{i-1}$ filtering units of the i-th level in the tree, and wherein the $2^d$ respective components from said filtering module are the output low-frequency and high-frequency signals from the $2^{d-1}$ filtering units of the d-th level in the tree,
and wherein each filtering unit has:
a first branch, comprising a high-pass filter, for transforming the respective input signal of the filtering unit into the respective output high-frequency signal; and
a second branch, comprising one of a polyphase low-pass filtering arrangement and a low-pass filter followed by a downsampler, for transforming the respective input signal of the filtering unit into the respective output low-frequency signal downsampled by a factor of two compared to the respective input signal and the respective output high-frequency signal.

2. The filter bank as claimed in claim 1, wherein said low-frequency component is downsampled by a factor $2^d$ compared to the input signal, and wherein said $2^d-1$ higher-frequency components include a highest-frequency component having as many samples as the input signal and, if d>1, further components oversampled by respective factors $2^i$ compared to said low-frequency component, each i being an integer greater than 0 and smaller than d.

3. The filter bank as claimed in claim 1, wherein the K subband components include said $2^d-1$ higher-frequency components.

4. The filter bank as claimed in claim 3, wherein the subband decomposition is performed over one scale and the K subband components further include said low-frequency component.

5. The filter bank as claimed in claim 1, wherein the subband decomposition is performed over multiple scales, the filter bank comprising at least J filtering modules organized in a tree structure having J levels, J being the number of scales of the subband decomposition, wherein each of the filtering modules is arranged to transform a respective input signal into $2^d$ respective components including a low-frequency component and $2^d-1$ higher-frequency components oversampled compared to the respective low-frequency component, and wherein the input signal of the filter bank is the respective input signal of a filtering module at the root of the tree structure.

6. The filter bank as claimed in claim 5, wherein the filter bank has one filtering module per level in the tree structure, and wherein, for j =1, . . ., J−1, the low-frequency component from the filtering module of the j-th level is the input signal to the filtering module of the (j+1)-th level.

7. The filter bank as claimed in claim 6, wherein the K subband components include the low-frequency component from the filtering module of the J-th level and the $2^d-1$ higher-frequency components from each one of the J filtering modules of the tree structure.

8. The filter bank as claimed in claim 7, wherein the low-frequency component from the filtering module of the J-th level is downsampled by a factor $2^{d.J}$ compared to the input signal, and wherein the K subband components include:
the low-frequency component from the filtering module of the J-th level;
a highest-frequency component oversampled by a factor $2^d$ compared to said low-frequency component; and
if at least one of d and J is greater than 1, further components oversampled by respective factors $2^i$ compared to said low-frequency component, each i being an integer greater than 0 and smaller than d.J.

9. A filter bank for reconstruction of an output signal from a number K of processed subband components, comprising a filtering module for generating the output signal from $2^d$ components obtained from the K subband components, including a low-frequency component and $2^d-1$ higher-frequency components, d being an integer at least equal to 1 representing a dimension of the output signal,
wherein said $2^d-1$ higher-frequency components are oversampled compared to said low-frequency component,
wherein each filtering module is made of $2^d-1$ filtering units arranged in a binary tree having d levels, wherein, for $1 \leq i \leq d$, the i-th level in the tree has $2^{d-i}$ filtering units each receiving a respective input low-frequency signal and a respective input high-frequency signal oversampled compared to said respective input low-frequency signal and producing a respective output signal,
wherein the $2^d$ respective input components supplied to said filtering module are distributed as respective input low-frequency and high-frequency signals to the $2^{d-1}$ filtering units of the first level in the tree, wherein, for any i>1, the respective input low-frequency and high-frequency signals of the $2^{d-i}$ filtering units of the i-th level in the tree are the respective output signals from the $2^{d-i+1}$ filtering units of the (i−1)-th level in the tree, and wherein the output signal of said filtering module is the output signal of the filtering unit of the d-th level in the tree,
and wherein at least one of the filtering units has:
  a first branch for filtering an upsampled version of the respective input low-frequency signal of the filtering unit to form a first component signal;
  a second branch for filtering a first modified version of the respective input high-frequency signal of the filtering unit, in which the odd samples are replaced by zeroes, to form a second component signal;
  a first adder to form a first partially reconstructed signal as a sum of the first and second component signals;
  a third branch for filtering the partially reconstructed signal to form a third component signal;
  a fourth branch for filtering a second modified version of the respective input high-frequency signal of the filtering unit, in which the even samples are replaced by zeroes, to form a fourth component signal;
  a second adder to form a second partially reconstructed signal as a sum of the third and fourth component signals; and
  a combiner to produce the respective output signal of the filtering unit as a combination of the first and second partially reconstructed signals.

10. The filter bank as claimed in claim 9, wherein the output signal is oversampled by a factor $2^d$ compared to said low-frequency component, and wherein said $2^d-1$ higher-frequency components include a highest-frequency component having as many samples as the output signal and, if d >1, further components oversampled by respective factors $2^i$ compared to said low-frequency component, each i being an integer greater than 0 and smaller than d.

11. The filter bank as claimed in claim 9, wherein said $2^d-1$ higher-frequency components are components from said K subband components.

12. The filter bank as claimed in claim 11, wherein the subband components result from a decomposition over one scale, and the K subband components further include said low-frequency component.

13. The filter bank as claimed in claim 9, wherein the subband components result from a decomposition over multiple scales, the filter bank comprising J filtering modules organized in a tree structure having J levels, J being the number of scales of the decomposition, wherein each of the filtering modules is arranged to transform $2^d$ respective input components, including a low-frequency component and $2^d-1$ higher-frequency components oversampled compared to the respective low-frequency component, into a respective output signal, wherein the output signal from a filtering module at the root of the tree structure is the output signal of the filter bank.

14. The filter bank as claimed in claim 13, wherein the filter bank has one filtering module per level in the tree structure, and wherein, for j =1, . . ., J—1, the output signal from the filtering module of the j-th level is the respective low-frequency component supplied to the filtering module of the (j+1)-th level.

15. The filter bank as claimed in claim 14, wherein the $2^d-1$ higher-frequency components supplied to each one of the J filtering modules of the tree structure and the low-frequency component supplied to the filtering module of the first level are components from said K subband components.

16. The filter bank as claimed in claim 15, wherein the output signal is oversampled by a factor $2^{d \cdot J}$ compared to the low-frequency component supplied to the filtering module of the first level of the tree structure, and wherein the K subband components include:
  the low-frequency component supplied to the filtering module of the first level;
  a highest-frequency component oversampled by a factor $2^d$ compared to said low-frequency component; and
  if at least one of d and J is greater than 1, further components oversampled by respective factors $2^i$ compared to said low-frequency component, each i being an integer greater than 0 and smaller than d.J.

17. The filter bank as claimed in claim 9, wherein the combination performed by the combiner is a weighted sum of the first and second partially reconstructed signals.

18. The filter bank as claimed in claim 17, wherein the weighted sum of the first and second partially reconstructed signals is performed with equal weight coefficients.

19. The filter bank as claimed in claim 9, wherein, the K processed subband components being obtained from a subband decomposition involving a low-pass filter $h_1$ and a high-pass filter $g_1$, the filtering performed in said first and second branches is based on respective filters $h_2$ and $g_2$ such that the filter pairs $\{h_1, g_1\}$ and $\{h_2, g_2\}$ verify a perfect reconstruction property, wherein the filtering performed in said third branch is based on a combination of filters $h_1$ and $h_2$, and wherein the filtering performed in said fourth branch is also based on filter $g_2$.

20. A filter bank for reconstruction of an output signal from a number K of processed subband components, comprising a filtering module for generating the output signal from $2^d$ components obtained from the K subband components, including a low-frequency component and $2^d-1$ higher-frequency components, d being an integer at least equal to 1 representing a dimension of the output signal,
  wherein said $2^d-1$ higher-frequency components are oversampled compared to said low-frequency component,
  wherein each filtering module is made of $2^d-1$ filtering units arranged in a binary tree having d levels, wherein, for $1 \leq i \leq d$, the i-th level in the tree has $2^{d-i}$ filtering units each receiving a respective input low-frequency signal and a respective input high-frequency signal oversampled compared to said respective input low-frequency signal and producing a respective output signal,
  wherein the $2^d$ respective input components supplied to said filtering module are distributed as respective input low-frequency and high-frequency signals to the $2^{d-1}$ filtering units of the first level in the tree, wherein, for any i >1, the respective input low-frequency and high-frequency signals of the $2^{d-i}$ filtering units of the i-th level in the tree are the respective output signals from the $2^{d-i+1}$ filtering units of the (i−1)-th level in the tree, and wherein the output signal of said filtering module is the output signal of the filtering unit of the d-th level in the tree and wherein at least one of the filtering units has:
- a first filter for generating a first even sub-component from the respective input low-frequency signal of the filtering unit;
- a second filter for generating a first odd sub-component from the respective input low-frequency signal of the filtering unit;
- a third filter for generating a second even sub-component from a first downsampled version of the respective input high-frequency signal of the filtering unit;
- a fourth filter for generating a second odd sub-component from said first downsampled version of the input high-frequency signal;
- a fifth filter for generating a third even sub-component from a second downsampled version of the respective input high-frequency signal of the filtering unit;
- a sixth filter for generating a third odd sub-component from said second downsampled version of the input high-frequency signal;
- a combiner to produce the respective output signal of the filtering unit having even components respectively obtained as a sum of the first, second and third even sub-components and as a sum of the first, second and third odd sub-components.

21. The filter bank as claimed in claim 20, wherein, the K processed subband components being obtained from a subband decomposition involving a high-pass filter $g_1$ and a low-pass filter $h_1$ implemented in a polyphase filtering arrangement, said first, second, third, fourth, fifth and sixth filters are defined from said low-pass and high-pass filters $h_1$, $g_1$ and from respective inverse filters $h_2$ and $g_2$ such that the filter pairs $\{h_1, g_1\}$ and $\{h_2, g_2\}$ verify a perfect reconstruction property, wherein:
- the first filter has a z-transform $\hat{x}_1(z)=a.\hat{h}_{2e}(z)+(1-a).z^{-1}.\hat{h}_{2o}(z).\hat{h}'_o(z)$;
- the second filter has a z-transform $\hat{x}_2(z)=a.\hat{h}_{2o}(z)+(1-a).\hat{h}_{2e}(z).\hat{h}_{2e}(z).\hat{h}'_o(z)$;
- the third filter has a z-transform $\hat{x}_3(z)=a.\hat{g}_{2e}(z)+(1-a).z^{-1}.\hat{h}_{2o}(z).\hat{g}'_o(z)$;
- the fourth filter has a z-transform $\hat{x}_4(z)=a.\hat{g}_{2o}(z)+(1-a).\hat{h}_{2e}(z).\hat{g}'_o(z)$;
- the fifth filter has a z-transform $\hat{x}_5(z)=(1-a).z^{-1}.\hat{g}_{2o}(z)$; and
- the sixth filter has a z-transform $\hat{x}_6(z)=(1-a).\hat{g}_{2e}(z)$, where $\hat{h}_{2e}(z)$ and $\hat{h}_{2o}(z)$ represent the z-transforms of the even and odd components $h_{2e}$ and $h_{2o}$ of the inverse filter $h_2$, respectively, $\hat{g}_{2e}(z)$ and $\hat{g}_{2o}(z)$ represent the z-transforms of the even and odd components $g_{2e}$ and $g_{2o}$ of the inverse filter $g_2$, respectively, $\hat{h}'_o(z)$ and $\hat{g}'_o(z)$ represent the z-transforms of the odd components of $h'=h_2*h_1$ and of $g'=g_2*h_1$, respectively, where $*$ designates convolution, and where a designates a weighting coefficient selected larger than 0 and strictly smaller than 1.

22. The filter bank as claimed in claim 21, wherein $a = \frac{1}{2}$.

23. The filter bank as claimed in claim 21, wherein the filters $h_1$, $g_1$, $h_2$ and $g_2$ are Haar wavelet filters having z-transforms $\hat{h}_1(z)=(1+z)/\sqrt{2}$, $\hat{g}_1(z)=(1-z)/\sqrt{2}$, $\hat{h}_2(z)=(1+z^{-1})/\sqrt{2}$ and $\hat{g}_2(z)=(1-z^{-1})/\sqrt{2}$, and wherein the z-transforms of said first, second, third, fourth, fifth and sixth filters are defined as:

$$\hat{x}_1(z) = \frac{1}{2\sqrt{2}} \cdot (1+a+(1-a) \cdot z^{-1}),$$

$$\hat{x}_2(z) = \frac{1}{2\sqrt{2}} \cdot (1+a+(1-a) \cdot z),$$

$$\hat{x}_3(z) = \frac{1}{2\sqrt{2}} \cdot (1+a-(1-a) \cdot z^{-1}),$$

$$\hat{x}_4(z) = \frac{1}{2\sqrt{2}} \cdot (-(1+a)+(1-a) \cdot z),$$

$$\hat{x}_5(z) = -\frac{1-a}{\sqrt{2}} \cdot z^{-1}, \text{ and } \hat{x}_6(z) = \frac{1-a}{\sqrt{2}} \cdot z.$$

24. An enhancement system for two-dimensional signals, comprising:
- a first filter bank for subband decomposition of an input two-dimensional image signal into a number K of subband components;
- a subband enhancement module for processing the K subband components from the first filter bank and forming K enhanced subband components; and
- a second filter bank for reconstruction of an output two-dimensional image signal from the K enhanced subband components,
wherein the first filter bank comprises a first filtering module for transforming the input two-dimensional image signal into four components including a first low-frequency component and three first higher-frequency components oversampled compared to said first low-frequency component, and wherein the second filter bank comprises a second filtering module for generating the output two-dimensional image signal from four components obtained from the K enhanced subband components, including a second low-frequency component and three second higher-frequency components oversampled compared to said second low-frequency component.

25. The enhancement system as claimed in claim 24, wherein the subband decomposition is based on wavelet transforms.

26. The enhancement system as claimed in claim 24, wherein the subband enhancement module is arranged to perform a processing selected from thresholding, reduction of compression distortion, reduction of measurement noise and sharpness enhancement.

27. An enhancement system for three-dimensional signals, comprising:
- a first filter bank for subband decomposition of an input three-dimensional video signal into a number K of subband components;
- a subband enhancement module for processing the K subband components from the first filter bank and forming K enhanced subband components; and
- a second filter bank for reconstruction of an output three-dimensional video signal from the K enhanced subband components,
wherein the first filter bank comprises a first filtering module for transforming the input signal into eight components including a first low-frequency component and seven first higher-frequency components oversampled compared to said first low-frequency component,
and wherein the second filter bank comprises a second filtering module for generating the output three-dimensional video signal from eight components obtained from the K enhanced subband components, including a second low-frequency component and seven second higher-frequency components oversampled compared to said second low-frequency component.

28. The enhancement system as claimed in claim 27, wherein the subband decomposition is based on wavelet transforms.

29. The enhancement system as claimed in claim 27, wherein the subband enhancement module is arranged to perform a processing selected from thresholding, reduction of compression distortion, reduction of measurement noise and sharpness enhancement.

30. An enhancement system for d-dimensional signals, d being an integer at least equal to 1, comprising:
   a first filter bank for subband decomposition of an input signal into a number K of subband components, wherein the subband decomposition is based on wavelet transforms;
   a subband enhancement module for processing the K subband components from the first filter bank and forming K enhanced subband components; and
   a second filter bank for reconstruction of an output signal from the K enhanced subband components,
   wherein the first filter bank comprises a first filtering module for transforming the input signal into $2^d$ components including a first low-frequency component and $2^d-1$ first higher-frequency components oversampled compared to said first low-frequency component,
   and wherein the second filter bank comprises a second filtering module for generating the output signal from $2^d$ components obtained from the K enhanced subband components, including a second low-frequency component and $2^d-1$ second higher-frequency components oversampled compared to said second low-frequency component.

31. The enhancement system as claimed in claim 30, wherein the subband enhancement module is arranged to perform a processing selected from thresholding, reduction of compression distortion, reduction of measurement noise and sharpness enhancement.

* * * * *

UNITED STATES PATENT AND TRADEMARK OFFICE
CERTIFICATE OF CORRECTION

PATENT NO. : 8,620,979 B2
APPLICATION NO. : 12/740233
DATED : December 31, 2013
INVENTOR(S) : Mallat It is certified that error appears in the above-identified patent and that said Letters Patent is hereby corrected as shown below:

On the Title Page, in Item [57], under "ABSTRACT", in Column 2, Line 5, delete "components ($F_1$)," and insert -- components ($F_1$). --, therefor.

On Title Page 2, in Item [56], under "OTHER PUBLICATIONS", in Column 1, Line 25, delete "Priceton," and insert -- Princeton, --, therefor.

In the Specification

Columns 7 & 8, Lines 67 & 1, delete "$h_2[n] = h_1[-n]$" and insert -- $h_2[n] = h_1[-n]$ --, therefor.

Column 8, Line 66, delete "$\bar{L}_1[n]\bar{L}[n/2]$" and insert -- $\bar{L}_1[n] = \bar{L}[n/2]$ --, therefor.

Column 10, Line 8, delete "$\hat{x}_3(z) = a\cdot\hat{g}_{2e}(z) + (1-a)^{-1}\cdot\hat{h}^{2o}(z)\cdot\hat{g}'_o(z)$" and insert -- $\hat{x}_3(z) = a\cdot\hat{g}_{2s}(z) + (1-a)\cdot z^{-1}\cdot\hat{h}_{2o}(z)\cdot\hat{g}_o(z)$ --, therefor.

Column 13, Line 9, delete "units 1000, 1100" and insert -- units 1000, 1010 --, therefor.

Column 13, Line 63, delete "$F_1 - F_8$" and insert -- $\bar{F}_1 - \bar{F}_8$ --, therefor.

Column 15, Line 20, delete "filters, The" and insert -- filters. The --, therefor.

Signed and Sealed this
Twentieth Day of May, 2014

Michelle K. Lee
*Deputy Director of the United States Patent and Trademark Office*

CERTIFICATE OF CORRECTION (continued)
U.S. Pat. No. 8,620,979 B2

In the Claims

Column 18, Line 67, in Claim 20, delete "tree" and insert -- tree, --, therefor.

Column 19, Line 38, in Claim 21, delete " $(1-a).\hat{h}_{2e}(z).\hat{h}_{2e}(z).\hat{h}'_o(z);$ " and insert -- $(1-a).\hat{h}_{2e}(z).\hat{h}'_o(z);$ --, therefor.

UNITED STATES PATENT AND TRADEMARK OFFICE
CERTIFICATE OF CORRECTION

PATENT NO. : 8,620,979 B2  
APPLICATION NO. : 12/740233  
DATED : December 31, 2013  
INVENTOR(S) : Mallat Page 1 of 1

It is certified that error appears in the above-identified patent and that said Letters Patent is hereby corrected as shown below:

In the Claims

Column 18, Line 35, in Claim 19, delete "$\{h_1,g_l\}$" and insert -- $\{h_1,g_1\}$ --, therefor.

Column 19, Line 32, in Claim 21, delete "$\{h_1,g_l\}$" and insert -- $\{h_1,g_1\}$ --, therefor.

Signed and Sealed this
Twenty-sixth Day of August, 2014

Michelle K. Lee
*Deputy Director of the United States Patent and Trademark Office*